United States Patent

Wei et al.

[11] Patent Number: 5,843,813
[45] Date of Patent: Dec. 1, 1998

[54] I/O DRIVER DESIGN FOR SIMULTANEOUS SWITCHING NOISE MINIMIZATION AND ESD PERFORMANCE ENHANCEMENT

[75] Inventors: Hua-Fang Wei, Sunnyvale; Michael Colwell, Fremont, both of Calif.; Randall E. Bach, Stillwater, Minn.

[73] Assignee: LSI Logic Corporation, Milpitas, Calif.

[21] Appl. No.: 748,372

[22] Filed: Nov. 13, 1996

Related U.S. Application Data

[63] Continuation-in-part of Ser. No. 684,022, Jul. 19, 1996, Pat. No. 5,728,612.

[51] Int. Cl.⁶ .................................................. H01L 21/8238
[52] U.S. Cl. ........................ 438/200; 438/133; 438/210; 438/238; 438/307
[58] Field of Search ..................................... 438/200, 210, 438/238, 133, 223, 224, 227, 228, 306, 307

[56] References Cited

U.S. PATENT DOCUMENTS

| | | | |
|---|---|---|---|
| 5,030,581 | 7/1991 | Yakushiji et al. | 438/135 |
| 5,134,088 | 7/1992 | Zetterlund | 438/210 |
| 5,182,220 | 1/1993 | Ker et al. | 438/200 |
| 5,225,702 | 7/1993 | Chatterjee | 257/363 |
| 5,246,872 | 9/1993 | Mortensen | 438/200 |
| 5,343,053 | 8/1994 | Avery | 257/173 |
| 5,346,835 | 9/1994 | Malhi et al. | 438/200 |
| 5,369,041 | 11/1994 | Duvvury | 438/133 |
| 5,430,595 | 7/1995 | Wagner et al. | 257/355 |

Primary Examiner—Michael Trinh
Attorney, Agent, or Firm—Marger, Johnson McCollom & Stolowitz, P.C.

[57] ABSTRACT

VLSI I/O structures to reduce the effects of simultaneous switching noise (SSN) on output driver circuits and enhance electrostatic discharge immunity, while reducing chip area, in both input receiver circuits and output driver circuits include improved transistors having deep-junction drain and a multi-cascaded, resistive deep-junction source structure.

5 Claims, 14 Drawing Sheets

I/O DRIVER DESIGN FOR SIMULTANEOUS SWITCHING NOISE MINIMIZATION AND ESD PERFORMANCE ENHANCEMENT

RELATED APPLICATION DATA

This application is a continuation-in-part of commonly-assigned application Ser. No. 08/684,022 filed Jul. 19, 1996, now U.S. Pat. No. 5,728,612, incorporated herein by this reference.

FIELD OF THE INVENTION

This invention is generally in the field of CMOS integrated circuit devices and systems, and more specifically includes improved methods and circuit designs for VLSI I/O structures to reduce the effects of simultaneous switching noise (SSN) on output driver circuits and to enhance electrostatic discharge immunity, while reducing chip area, in both input receiver circuits and output driver circuits.

BACKGROUND OF THE INVENTION

Simultaneous Switching Noise (SSN)

When the outputs of a VLSI system switch logic states simultaneously, power/ground noise is generated in on-chip power and ground buses. This noise is called simultaneous switching noise (SSN). It is commonly referred to as "ground bounce" for high to low transitions and "power drop" for low to high transitions. The SSN can cause false switching in the system. To avoid false switching, SSN must be minimized and the maximum number of simultaneously switching outputs must be carefully limited. Simultaneous switching noise is explained further in connection with output buffer circuitry.

FIG. 1 is a schematic diagram of an output buffer circuit used in CMOS VLSI applications. In this illustrative output buffer, it can be observed that eight pairs of p-type transistors are connected between the output terminal Z and the power supply Vdd, while eight pairs of n-type transistors are connected in parallel between the Z output terminal and Vss. Multiple parallel devices are used to increase drive capability. The driver transistors are controlled by NAND, NOR and inverter gates forming pre-driver logic, as is known. The pre-driver logic is powered by a separate Vdd2/Vss2 supply as is illustrated by example at NAND gates 16,18.

FIG. 2 is schematic diagram of an I/O cluster model useful for simulation of SSN conditions and measurements of SSN effects in output buffer circuits. In FIG. 2, a series of buffers #1 through #N, each buffer being generally of the type illustrated in FIG. 1, are arranged to receive a common input pulse 22, applied over a common bus 24 to the A signal input of each buffer. Buffers #1 through #N are also controlled by common enable signals (EN) shown together as bus 26, and common enable signals ENB shown together as bus 28. All of the enable signals EN are connected to Vdd2 while the ENB signals are connected to Vss2 so that all of the buffers are enabled for the simulation. An additional "Quiet Buffer" 30 also is arranged to receive the common EN and ENB signals. Quiet buffer 30 receives an input signal 32 at its input terminal A'. This circuit is arranged so that all of the Buffers #1 to #N switch states in response to pulse 22 while the quiet buffer remains in a fixed state. All of the driver output stages are powered by Vdd/Vss, while the NOR, NAND and inverter pre-driver logic circuits are powered by the Vdd2/Vss2 supply as described above.

External power supply terminal Vdd is connected through a packaging model 50. The amount of SSN is proportional to the inductance of the power distribution network through which the switching current travels. The inductance that contributes to the SSN comprises the bond wire, package trace, and package pin. These factors are taken into account in the modeling element 50. The substrate or ground terminal Vss similarly is connected through a packaging model 60 to the Vss bus 64 which in turn is connected to all of the buffers as shown. Each of the buffers #1 through #N has a respective signal output Z which is coupled through a packaging model 72, for example, to the final output $Z_0$. The quiet buffer 30 has an output Z' which is coupled through a packaging model 78 to the quiet output terminal 80. The I/O cluster model just described was used for HSPICE simulations to determine effects of various packaging models, and ratios of signal to power/ground for various buffers, and to study cluster IO simultaneous switching. Simulations show that SSN severely limits the signal to power/ground ratio in highly integrated chip designs, resulting in lower signal counts per die.

FIG. 3 is a plot of simulation results showing power/ground noise in a single switching buffer along with a quiet buffer. This simulation was for a medium sized buffer (50 mA) in which $W_n$=121 μm, $W_p$=245 μm. It is of interest to note the minimum Vdd voltage drop when SSO drivers are switching to high, and the maximum Vss ("ground bounce") when the drivers are switching to the low state. In the plot, one can observe that the Vdd having a nominal value of 3.3 volts drops to approximately 2.7 volts minimum, and, when the driver switches low, the ground signal VSS bounces up slightly in excess of 500 mV. A reasonable design criteria would be to ensure the Vss ground bounce and the quiet buffer maximum signal output at the low state do not exceed 0.8V. The minimum Vdd and the quiet buffer minimum signal output at the logic high state must be at least 2.0 V under worst case conditions for TTL compatibility.

FIG. 4 is a plot of signal integrity in the quiet buffer with one SSO buffer. Circles "A" indicate voltage drops of concern during the logic high state, and circles "B" indicate voltage peaks of concern during the logic low state, all resulting from SSN. The simultaneous switching noise is a function of several variables, as indicated in the model of FIG. 2, described above. In general, simulations of this type show that signal to power/ground ratio must be strictly limited to avoid false switching in output buffers, especially smaller output buffers.

Several ways of addressing simultaneous switching noise are known in the prior art. One method, of course, is simply to skew the timing of various signals so as to avoid simultaneous switching. FIG. 4, for example, shows the switching noise effect persists for several nanoseconds. Thus, it would be useful to skew switching timing to insure at least a minimum of, say five nanoseconds between signal switching in the worst case. This approach, however, increases circuit timing complexity and of course can impose undue limitations on operating speed.

Another known approach to providing immunity to SSN is the use of damping resistors in series with the source terminals, for example in an output driver final stage. This approach is described in R. Senthinathan and J. L. Prince, "Simultaneous Switching Noise of CMOS Devices and Systems," (Kluwer, 1994). Senthinathan shows the use of damping resistors in a range of 10 to 100 ohms to achieve significant improvements in switching noise on output drivers. For example, FIG. 5 shows (in addition to the switching noise plot) a schematic diagram of an output drive final stage, including damping resistors in series with the source terminals of both the output driver transistors. The effects of damping resistors on power and signal integrity as a function of damping resistor size and the number of simultaneously switching outputs (SSO) is illustrated in the simulation plots of FIGS. 11–14.

The use of damping resistors in the driver does not require a tradeoff in speed, according to R. Senthinathan et al., but it does increase chip area. To illustrate, FIG. 7A is a cross-sectional view illustrating an n-type transistor with a polysilicon resistor connected in series with the source terminal. The damping resistors can be realized using diffusion resistors. Poly interconnect resistors provide smaller variations on the resistance values with process/temperature variations as compared with diffusion resistors. However, the poly resistors require greater area. FIG. 7B illustrates in top view a poly interconnect resistor in a boustrophedonic layout. In this arrangement, the resistance of the damping resistor is equal to L/W x sheet R (ohms per square). The polysilicon resistor requires significant silicon area. The need remains, therefore, for improvements in minimization of simultaneous switching noise, without dedicating silicon area to polysilicon damping resistors.

Electrostatic Discharge

A separate problem in the prior art, as alluded to above, is the prevention of electrostatic discharge (ESD) damage to circuit structures, for example to gate oxides at input buffers and to NMOS components at bidirectional buffers and output drivers. ESD results from circuit contact with a high-voltage source of static electricity. For example, a human frequently accumulates over 2 kV of electrostatic charge. To prevent damage, an on-chip ESD protection device must be provided for releasing built-up electrical charge at a voltage safely below the breakdown voltages for the gate oxides and the NMOS components. It is known to use an SCR-type integrated device for this purpose. Design of SCR devices for ESD protection is complicated, however, because of the tendency of such circuits toward latch up behavior and because of the need to absorb relatively substantial amounts of energy.

One solution to the need for ESD protection is a tunable, low-voltage triggering SCR device as described in commonly assigned copending application Ser. No. 08/556,599, U.S. Pat. No. 5,719,733, [LSI P-2673] entitled "ESD Protection for Deep Sub-Microns CMOS Devices With Minimum Trade-Off for Latch-Up Behavior." Such an SCR circuit is used, for example, to protect an input receiver as illustrated in the schematic diagram of FIG. 8. Referring to FIG. 8, an ESD resistor is formed in series between the I/O terminal and the input receiver, and the SCR is arranged to shunt high-voltage energy between the I/O terminal and ground. The SCR in combination with $R_{esd}$ provide what is called primary ESD protection. Secondary ESD protection can be provided by additional devices 202, 204, each arranged in diode configuration for limiting voltage swings at the input to the receiver circuit 210. One of the problems with the SCR approach for primary ESD protection is the relatively large area occupied by the resistor and the ESD device. This is illustrated in the floorplan shown in FIG. 9.

Commonly assigned patent application Ser. No. 08/684, 022 filed Jul. 19, 1996, entitled "Method for Forming Minimum Area Structures for Sub-Micron CMOS ESD Protection in Integrated Circuit Structures Without Extra Implant and Mask Steps and Articles Formed Thereby" describes methods and resulting structures for enlarging the effective volumes of one or more of the source, drain and/or emitter regions of integrated circuit structures such as an SCR structure for ESD protection. The additional effective volume allows the SCR device to handle additional energy from an electrostatic discharge applied, for example, to I/O contacts electrically connected to the SCR protection structure, without increasing the width of the structure.

According to that invention, the additional effective volume is obtained by forming deep doped regions or wells beneath one or more heavily doped source, drain, and emitter regions, at the same time and at the same depth and doping concentration as conventional p-wells and/or n-wells which are simultaneously formed in the substrate, so that no additional masks and implanting steps are required. Details of such structures are described later. Still, substantial chip area is required for ESD protection and the series resistors needed to reduce SSN on output structures further take up limited chip real estate. The need remains to reduce the size of I/O structures if possible, while minimizing SSN and still providing good ESD immunity.

SUMMARY OF THE INVENTION

The present invention integrates immunity to SSN and ESD enhancement—two areas separately addressed in the prior art. A new, integrated approach to these otherwise distinct problems leads to substantial reduction in chip area required for I/O structures. Another advantage of the invention is that it allows elimination of the SCR/resistor for high frequency applications. One aspect of the invention is an improved CMOS transistor structure for use in I/O structures. This improved structure is useful in input, output and bidirectional buffer applications. The improved transistor in an n-transistor embodiment has a deep-junction drain region and a multi-cascaded, resistive deep-junction source region. The deep junctions enhance driver ESD performance. The multi-cascaded, resistive source region provides a series resistance between the source terminal and substrate/ground while requiring less area than prior art diffused or polysilicon resistors. The series resistance reduces ground bounce and power supply drop resulting from simultaneous signal line switching, thereby allowing better signal to power/ground ratios. An analogous p-transistor can be formed also having a deep-junction drain region and a multi-cascaded, resistive deep-junction source region.

According to a second aspect of the invention, the improved n-type and p-type transistors are arranged in series between Vdd and Vss to form an output buffer circuit final stage, with the output terminal coupled to the common drain terminal.

Another aspect of the invention is an input receiver design that employs the improved transistors in a clamping diode configuration to provide secondary ESD protection. The deep-well structures of the invention improve ESD immunity by increasing the effective volume of the corresponding regions, thus improving secondary ESD protection in input receivers or output buffer (or bidirectional) applications. For some applications, the present invention allows the primary ESD resistor and SCR device to be reduced in size or eliminated entirely, with resulting improvements in useful circuit area.

Thus the present invention addresses two distinct problems—SSN and ESD—each of which required separate solution in the prior art. The present invention provides improved performance in dense CMOS integrated circuits while reducing chip area by addressing both ESD and SSN issues together, switching noise immunity in an output buffer application and, at the same time, improve ESD immunity. The foregoing and other objects, features and advantages of the invention will become more readily apparent from the following detailed description of a preferred embodiment of the invention which proceeds with reference to the accompanying drawings.

DETAILED DESCRIPTION OF A PREFERRED EMBODIMENT

The parent application Ser. No. 08/684,022 filed Jul. 19, 1996, describes and claims an improved SCR structure, illustrated in a preferred embodiment in FIG. 3 of that application, reproduced herein as FIG. 15. In the prior application, it was noted that the terms "individual N well" or "individual P well" is intended to define an N well or P well which is contiguous and in electrical contact with an individual P+ or N+ active region in the semiconductor substrate; while the terms "main N well" or "main P well" are intended to define a well of opposite conductivity to the substrate and formed in the substrate to permit the formation in such main well of a plurality of active regions of opposite conductivity type of the main well. The same nomenclature is adopted here. The structure of the improved SCR of the parent case is described herein as the present invention includes structures similar thereto in some respects, and the details of construction of the SCR taken together with the description of the present invention below will enable one skilled in the art to practice the present invention without undue experimentation.

Figure 15:
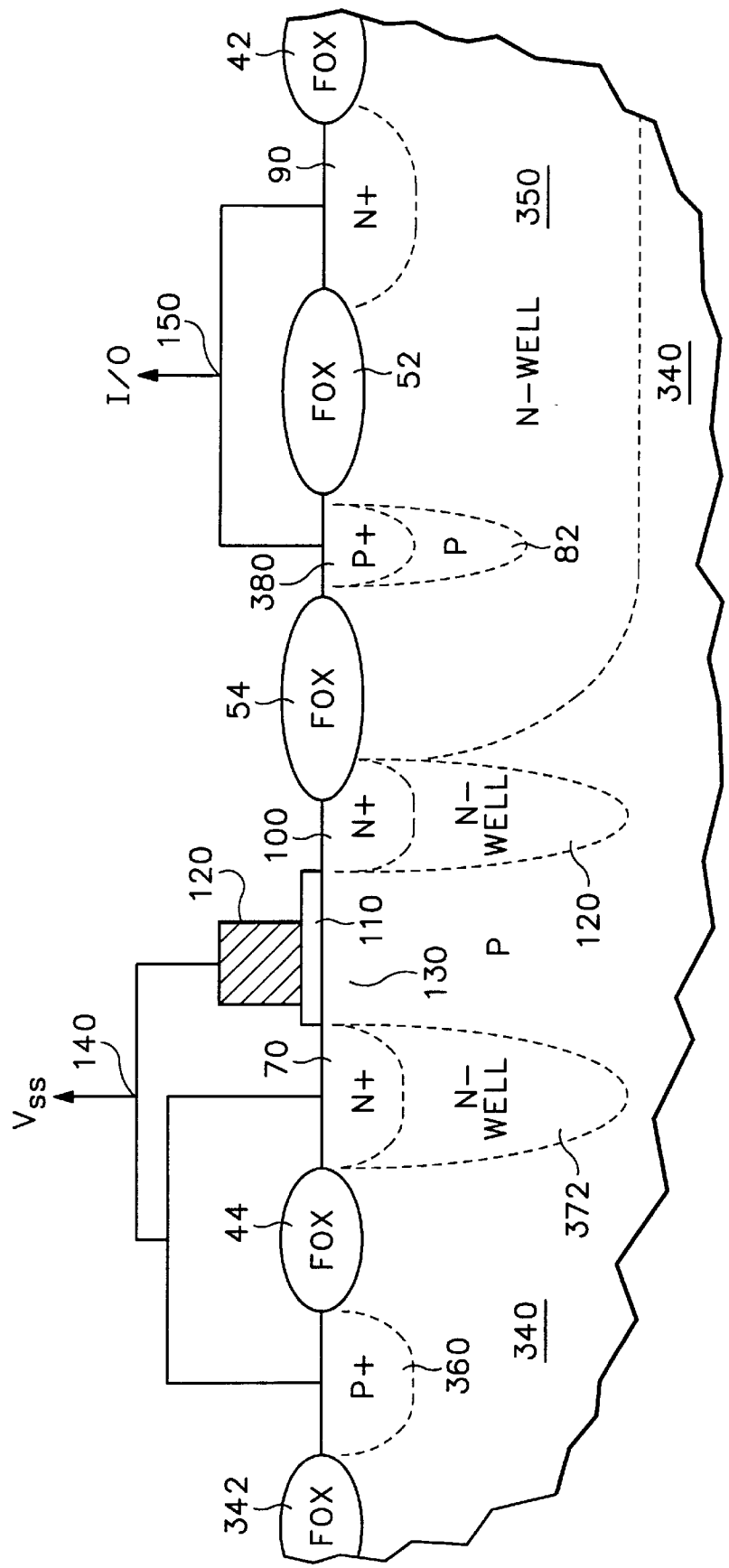
FIG. 15 is a cross-sectional view of an ESD protection structure described in the parent application.

Referring therefore to FIG. 15, a portion of a P doped semiconductor substrate 340 is shown in which the SCR structure of the prior invention is formed to provide the desired ESD protection. The active region of substrate 340 in which the SCR structure is formed is surrounded by a field oxide. Substrate 340 has a main N well 350 formed therein using either a retrograde well implant process or a conventional well implant process. While the illustrated embodiment shows no P well because the P doped semiconductor substrate 340 is either blanket deposited or initially formed to form a P well of the entire substrate, it will be appreciated that a separate P well could also be formed, particularly if the substrate is either intrinsic or only lightly P doped.

Description of the Process of Forming the Structure

As previously alluded to, one of the features of the invention is that the effective volume of one or more of the source, floating drain, and emitter regions can be extended by the provision of contiguous and electrically connected wells which can be formed without the use of extra masks or extra processing steps. Turning now to FIGS. 16–20, the process steps used to form the output structure of the embodiment of FIG. 10 will be illustrated.

Figure 16:
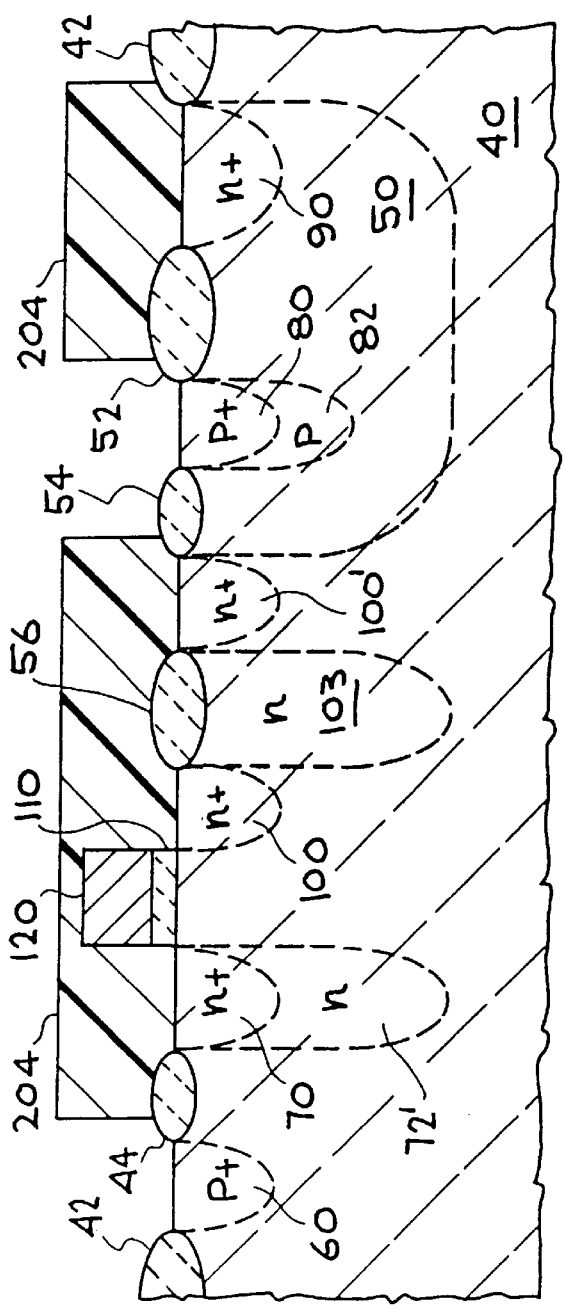
FIG. 16 is a fragmentary vertical cross-sectional view showing an initial stage of construction of the ESD protection structure of the invention showing formation of the main N well and the simultaneous formation of the small N wells of the same depth which are associated with the N+ source and drain regions of the MOSFET device of the SCR structure, as well as a small P well beneath the P+ emitter, to extend the respective effective volumes of the N+ source and drain regions and the P+ emitter region to thereby increase the overall volume of the ESD protection structure of the invention.

First of all, as shown in FIG. 16, the main N well 50 is formed by the conventional doping of P type substrate 40 with an N dopant, such as phosphorus or arsenic, at an energy level sufficient to obtain the desired depth of N well 50, but at a dosage level insufficient to form N+ doping. Conventionally, this would be carried out while masking the remainder of substrate 40, i.e., masking the regions where N well 50 would not be formed. However, in accordance with the invention, photoresist mask 180 is formed with openings 182, 184, 186, and 188 (instead of a single mask opening 188 for formation of main N well 50). Mask opening 182 corresponds to the location where individual N well 72 beneath N+ source region 70 is to be formed in substrate 40, while mask opening 184 corresponds to the location where individual N well 103 will be formed in substrate 40 beneath field oxide region 56, with mask portion 183 separating these two individual N wells.

Mask openings 186 and 188 are formed in mask 180 to provide for the formation of main N well 50 in substrate 40, with mask portion 185 separating mask opening 186 from mask opening 184. The reason for two mask openings, separated by narrow mask portion 187, is to permit the formation of shallower P well 82 in N well 50. Shallow P well 82 may be formed during the formation of N wells 72', 103 and main N well 50 simply by masking substrate 40, since substrate 40 is already P doped sufficiently to comprise a P well, so the purpose of mask portion 187 is merely to prevent the underlying P doped substrate to be N doped, thus resulting in the formation of P well 82. It should be noted, in this regard, that the length of mask portion 187 (distance between opening 186 and opening 188) may be varied to, in turn, regulate the length and depth of P well 82, i.e., the depth before the N doped substrate portion beneath mask opening 186 merges with the N doped substrate portion beneath mask opening 188 to form the single main N well 50 in substrate 40. Generally the length of mask portion 187 will usually be about ½ the length of mask portion 185.

Figure 17:
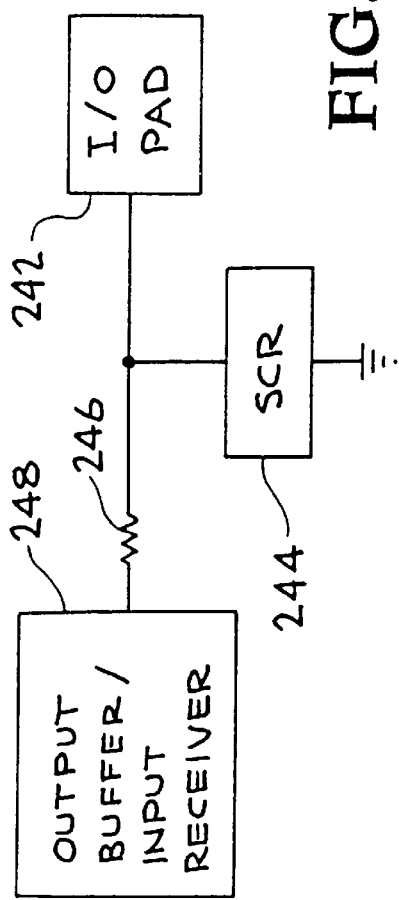
FIG. 17 is a fragmentary vertical cross-sectional view showing the masking of the active regions of the substrate while field oxide is grown to provide electrical isolation between the respective active regions.

After formation of N wells 72', 103, and main N well 50, as well as P well 82, mask 180 is removed, and all of the active area of substrate 40 is masked with a mask 190 having openings therein conforming to regions within the active area of substrate 40 where field oxide is to be grown, in addition to field oxide 42 which surrounds the active area. Thus, as shown in FIG. 17, field oxide portions 42, 44, 52, 54, and 56 are shown formed on and in substrate 40 in the openings in mask 190.

Figure 18:
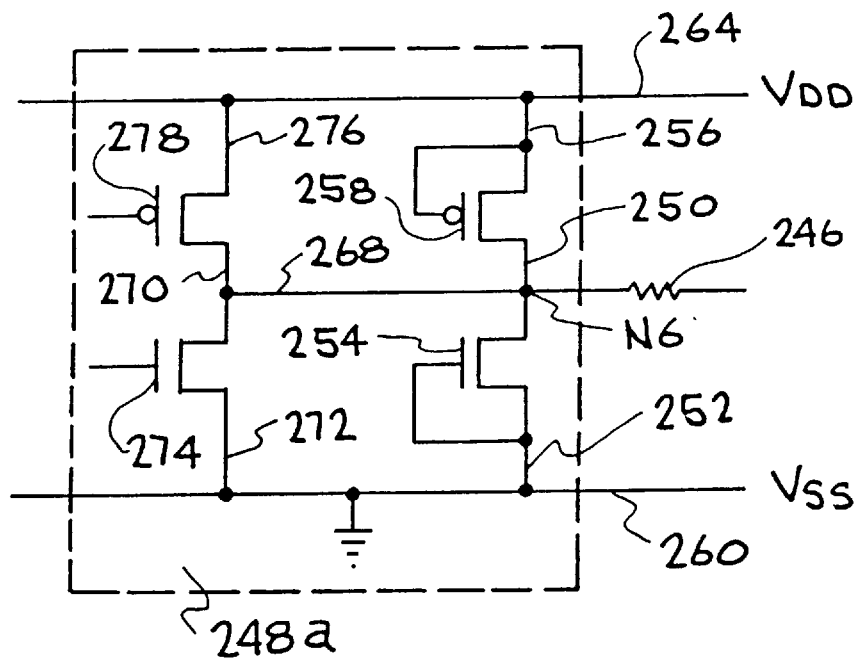
FIG. 18 is a fragmentary vertical cross-sectional view showing formation of the gate oxide and overlying gate electrode for the MOSFET device of the SCR structure of the invention.
Figure 19:
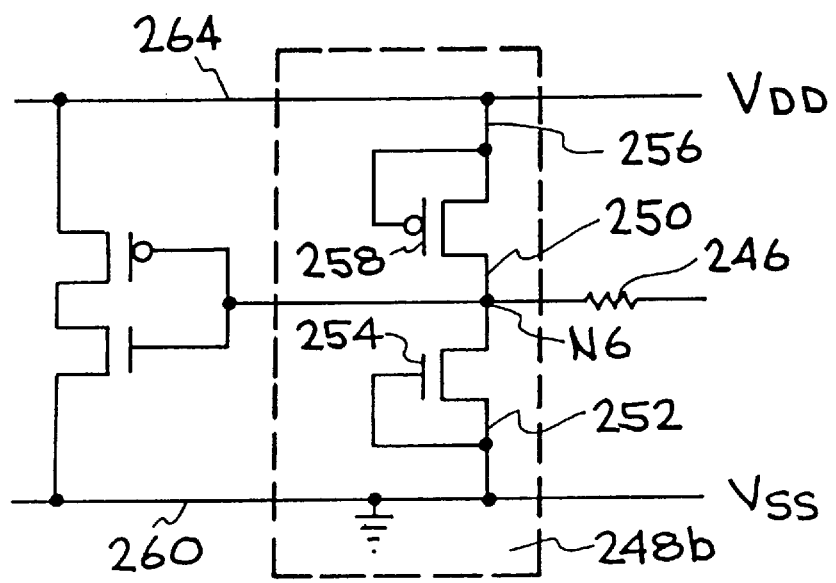
FIG. 19 is a fragmentary vertical cross-sectional view showing the N+ implantation of active regions of the substrate to form the N+ source, N+ drain and N+ contact for the N well, while other active regions are masked off.

Then, as shown in FIG. 18, field oxide mask 190 is removed and gate oxide 110 and gate electrode 120 are conventionally formed over the region of substrate 40 between N well 72 and N well 103. As shown in FIG. 19, N+ source region 70, N+ floating drain regions 100 and 100', and N+ contact region 90 may then be implanted by forming an implant mask 200 over portions of substrate 40 (including portions of N well 50), leaving exposed only those portions where the N+implantation is to be made. It should be noted that gate electrode 120 and the field oxide portions 42, 44, 52, 54, and 56 form a self-alignment mask for the respective formations of N+ source region 70, N+ floating drain regions 100 and 100', and N+ contact region 90.

Figure 20:
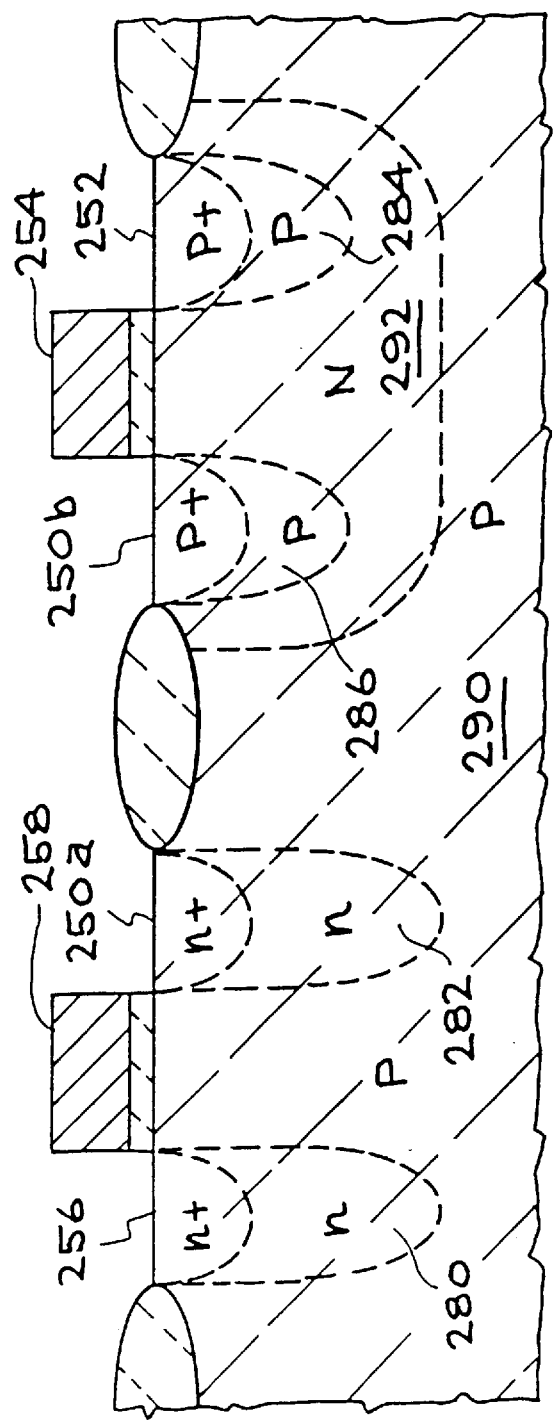
FIG. 20 is a fragmentary vertical cross-sectional view showing the P+ implantation of other active regions of the substrate where the P+ emitter and the P+ contact to the P substrate are formed, while other regions are masked off.

Following formation of the N+ regions, mask 200 may be removed and replaced with a second implant mask 204, as shown in FIG. 20, formed over the N+ implanted areas to permit formation of the P+ implants comprising P+ contact 60 and P+ emitter region 80.

It should be noted, in this regard, that the P+ and N+ implant steps may be reversed, as is well known to those skilled in the art. Furthermore, one of the implant masks, e.g., mask 200, could be eliminated by increasing the dosage of the N+ implant sufficiently so that the subsequent P+ implant does not sufficiently change the N+ doped regions to render their doping levels less than that of an N+ doped region.

Thus, it will be seen that the additional N wells 72 and 103, as well as the additional P well 82, are formed without any additional masking or processing steps needed, since, as shown in FIG. 16, individual N wells 72 and 103, as well as individual P well 82, are all formed at the same time as main N well 50, and the mask used to form main N well 50 may be modified for use in the simultaneous formation of N wells 72 and 103 and P well 82, i.e., no additional mask need be used. Furthermore, the subsequent step of masking active regions of substrate 40 shown in FIG. 17, is carried out regardless of the presence of the additional individual N wells and P well, and the remaining steps illustrated in FIGS. 18–20 are also carried out regardless of the presence or absence of the additional individual wells.

Therefore, using the structure and process of the invention, the energy dissipation capacity of the disclosed SCR structure may be increased sufficiently to handle the energy or power from a 2 kV HBM zapping mode with a circuitry width of less than 2.5 mils (63.5 $\mu$m) with an average junction depth of 0.2 $\mu$m or less, to provide the required ESD protection for integrated circuit structures such as I/O buffer circuits without, however, adding further processing steps or additional masking steps to the process.

While the structure and process of the invention have been illustrated with respect to their use with the primary ESD protection structure for an integrated circuit structure, and particularly with respect to the I/O buffers, the structure and process of the invention may also be used in connection with the CMOS devices used as ESD diodes, as well as with the CMOS used for the buffer drivers for output buffers, to provide secondary ESD protection for the integrated circuit structure. FIG. 17 shows, in diagram form, the relationship of I/O pad 242, the primary ESD protection structure comprising the SCR structure denoted at 244, the ESD resistor 246, and the output buffer and/or input receiver 248 for the N drivers and P drivers which provides secondary ESD protection for the remainder of the integrated circuit structure electrically connected thereto.

As explained in the prior application, substrate 340 is provided with a P+ contact region 360 which provides an electrical contact to P doped substrate 340 (or to a P well when a P well is used). An N+ source region 70 is also shown formed in substrate 340 and separated from P+ contact region 360 by a second field oxide region 44. In the illustrated embodiment shown in FIG. 15, a source N well region 372 is shown formed below N+ source region 70. Source N well region 372 has a depth equal to the depth of main N well 350, which, in accordance with the previous invention, enables both N wells to be simultaneously formed using the same masking and implantation steps, as will be discussed below. Source N well region 372 serves to extend the overall effective volume of N+ source region 70 of the SCR used in the ESD protection structure to enable the ESD protection structure to dissipate an increased amount of energy from the ESD. The exact shape and location of the source N well region associated with N+ source region 70 may vary, so long as it remains in physical and electrical contact with N+ source region 70, and its depth remains the same as main N well 350.

First P+ contact region 360 and N+ source region 70 preferably each have a length (as measured from left to right in the dimension illustrated in FIG. 15) of from about 1 μm to about (10,000 Angstroms) (Å)) to about 9 μm (90,000 Å), a width (the dimension into the paper in FIG. 15) of from about 1 mil (25.4 μm) to about 2.5 mils (63.5 μm), and a depth (height) of from about 0.1 μm (1,000 Å) to about 0.2 μm (2,000 Å). First P+ contact region 360 and N+ source contact region 70 preferably each have a carrier concentrations of from about $10^{19}$ to about $10^{21}$ atoms/cm$^3$.

Field oxide region 44, separating P+ contact region 360 and N+ source region 70, has a thickness (depth) preferably ranging from about 20 nanometers (20 nm or 200 Å) to about 600 nm (6000 Å), and a length (distance between first P+ contact region 360 and N+ source region 70) of from about 0.1 μm (100 nm or 1,000 Å) to about 10 μm (10,000 nm or 100,000 Å).

Figure 4:
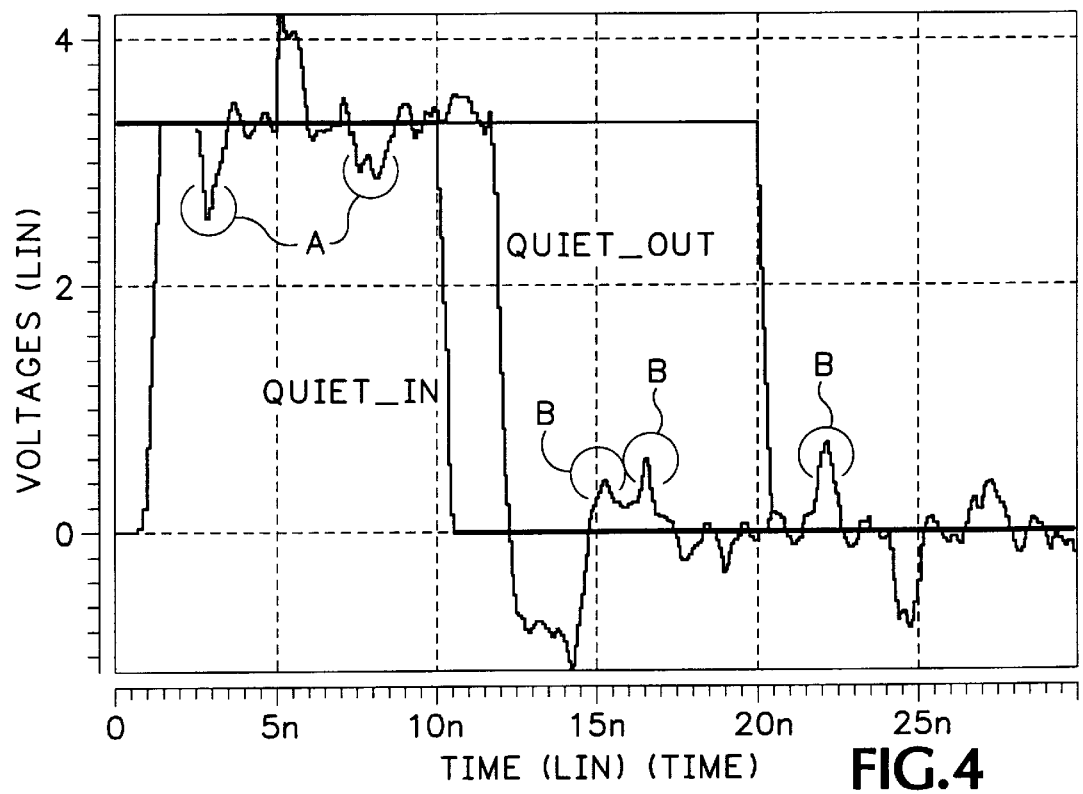
FIG. 4 is a plot of a signal integrity in the quiet buffer in the model of FIG. 2.
Figure 5:
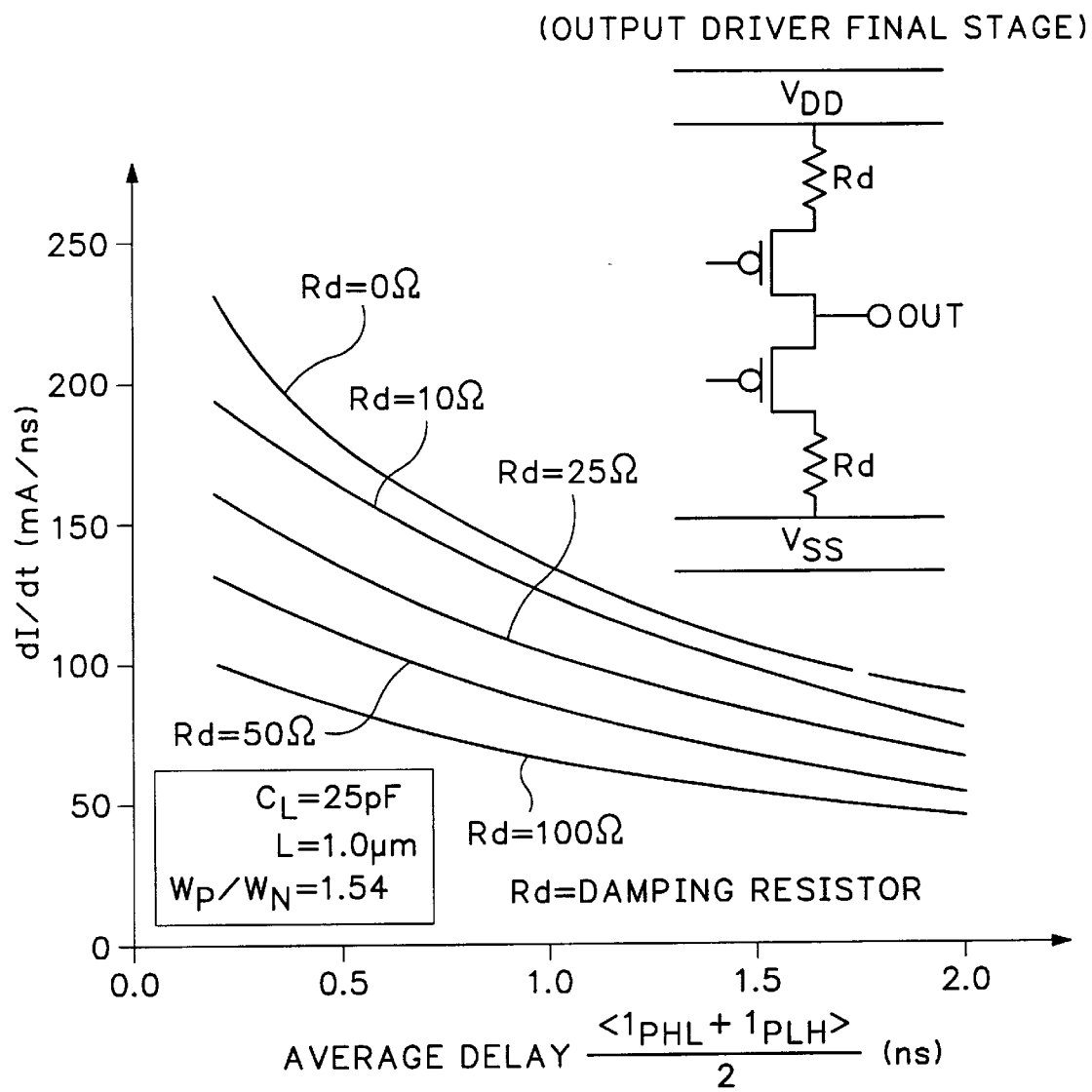
FIG. 5 (prior art) is a plot of performance vs. switching noise limitations in a generic CMOS output driver final stage, showing effects of series damping resistors of various values in a range up to 100 ohms.
Figure 6:
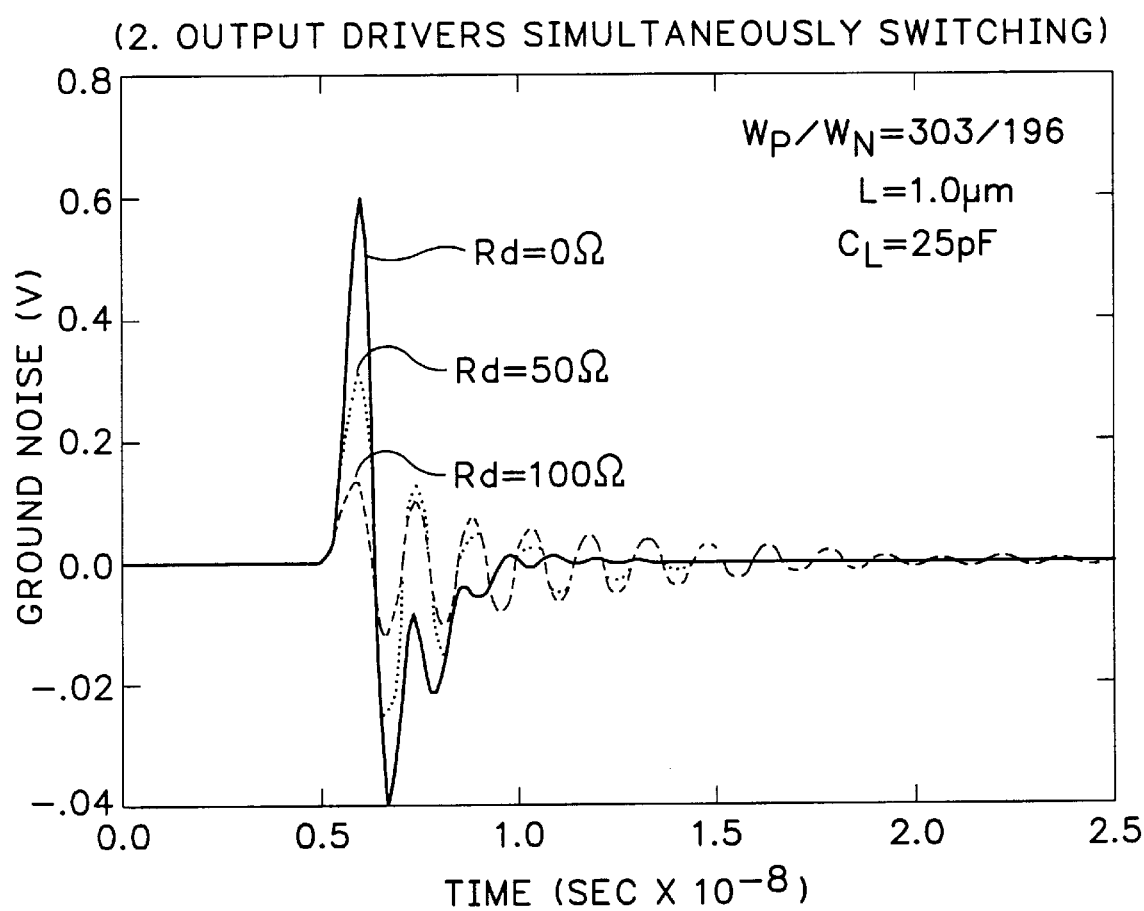
FIG. 6 (prior art) is a plot of ground noise vs. time showing underdamped oscillatory ground noise behavior for two output drivers switching simultaneously, again illustrating the efficacy of driver damping resistors.
Figure 7A:
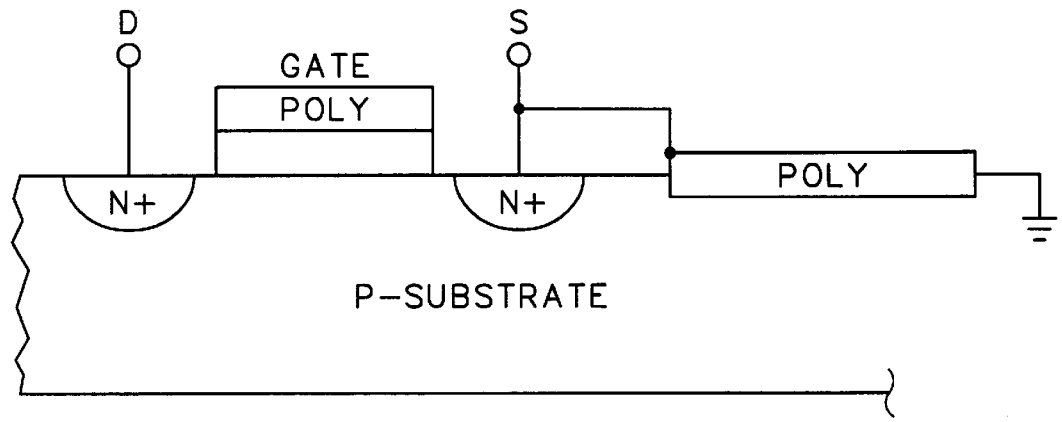
FIG. 7A is a cross-sectional view of an n-transistor with a damping resistor formed of polysilicon connected to the source terminal.
Figure 7B:
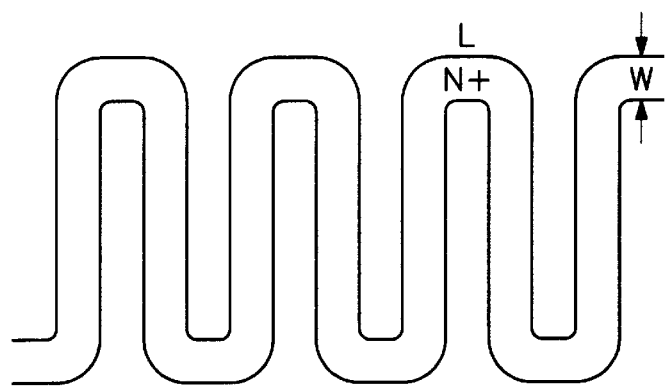
FIG. 7B is a top view of the polysilicon resistor of the structure of FIG. 7A.
Figure 8:
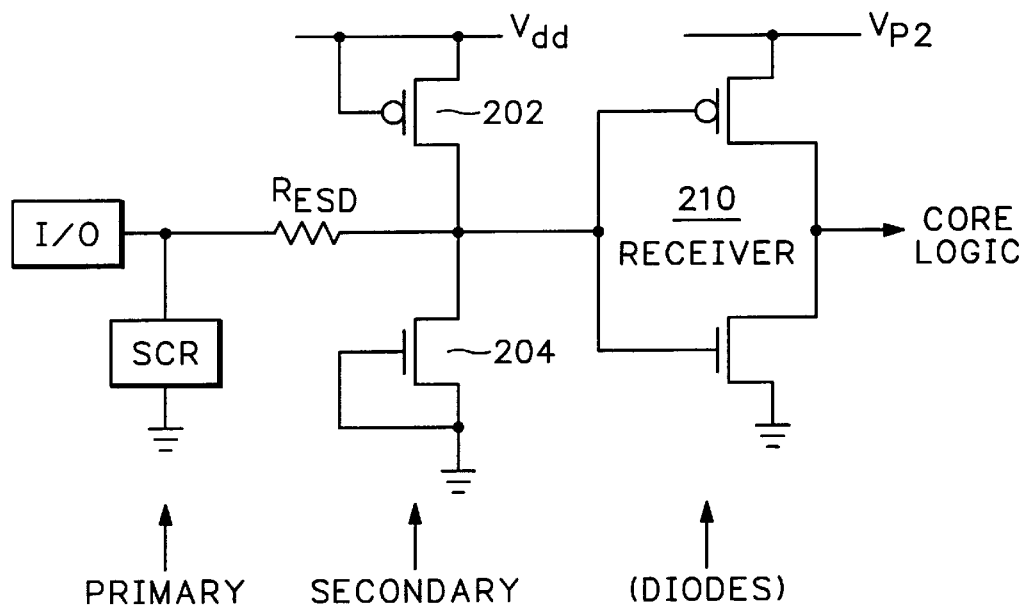
FIG. 8 is a schematic diagram of an input terminal and input receiver circuitry with primary and secondary ESD protection.
Figure 9:
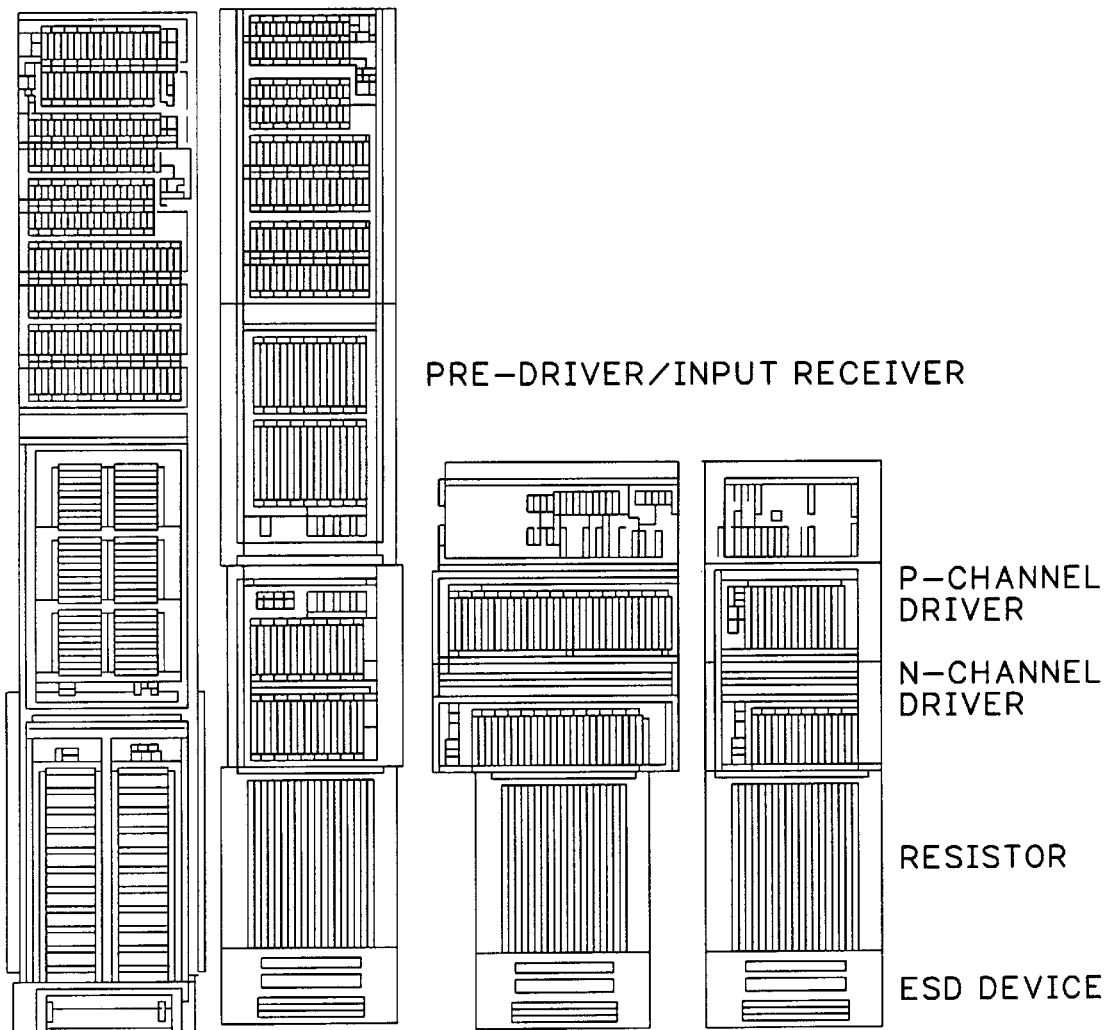
FIG. 9 is a floor-plan print showing chip area occupied by I/O structures and ESD protection structures in the prior art.

A P+ emitter region 380 and a N+ contact region 90 are formed in main N well 350, with N+ contact region 90 serving as an electrical contact to main N well 350. P+ emitter region 380 and N+ contact region 90 preferably each have a carrier concentrations of from about $10^{20}$ to about $10^{21}$ atoms/cm$^3$. P+ emitter region 380 and N+ contact region 90 are separated by a third field oxide region 52 which also has a thickness (depth) ranging from about 20 nm (200 Å) to about 600 nm (6000 Å), and a length (distance between second P+ contact region 380 and second N+ contact region 90) of from about 0.1 μm (100 nm or 1,000 Å) to about 10 μm (10,000 nm or 100,000 Å). Formed below P+ emitter region 380 is a P well 82 which is preferably formed at the same time as N wells 372 and 102 and main N well 350, although not to the same depth (to prevent shorting of P well 82 to P substrate 340), as will be discussed below. Adjacent the edge of main N well 350 is an N+ floating drain region 100 which serves as the drain for the MOSFET device of the SCR structure, but also as the base of a lateral parasitic PNP bipolar transistor as well as the base of a vertical PNP transistor, as will be discussed below with respect to FIG. 4. N+ floating drain region 100 preferably has a carrier concentration from about $10^{19}$ to about $10^{20}$ atoms/cm$^3$. N+ floating drain region 100 is separated from second P+ contact region 380 by a fourth field oxide region 54. Formed below N+ floating drain region 100 is an N well 102 which, like N well 372, is formed to a depth equal to the depth of main N well 350. N well 102 is formed at the same time as main N well 350 and N well 72, as will be discussed below.

Figure 1:
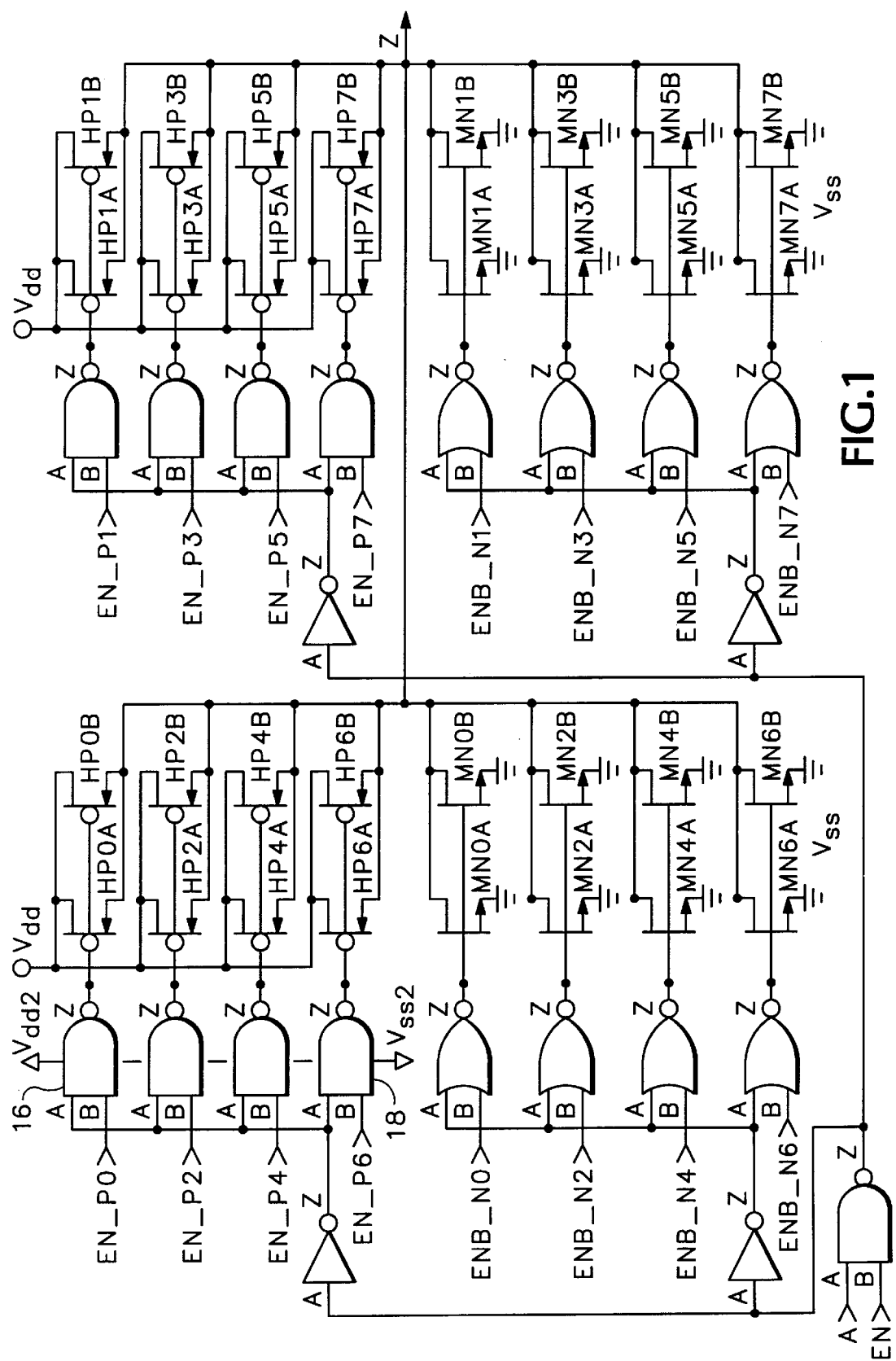
FIG. 1 is a schematic diagram of a typical output buffer circuit for use in a CMOS integrated circuit.
Figure 2:
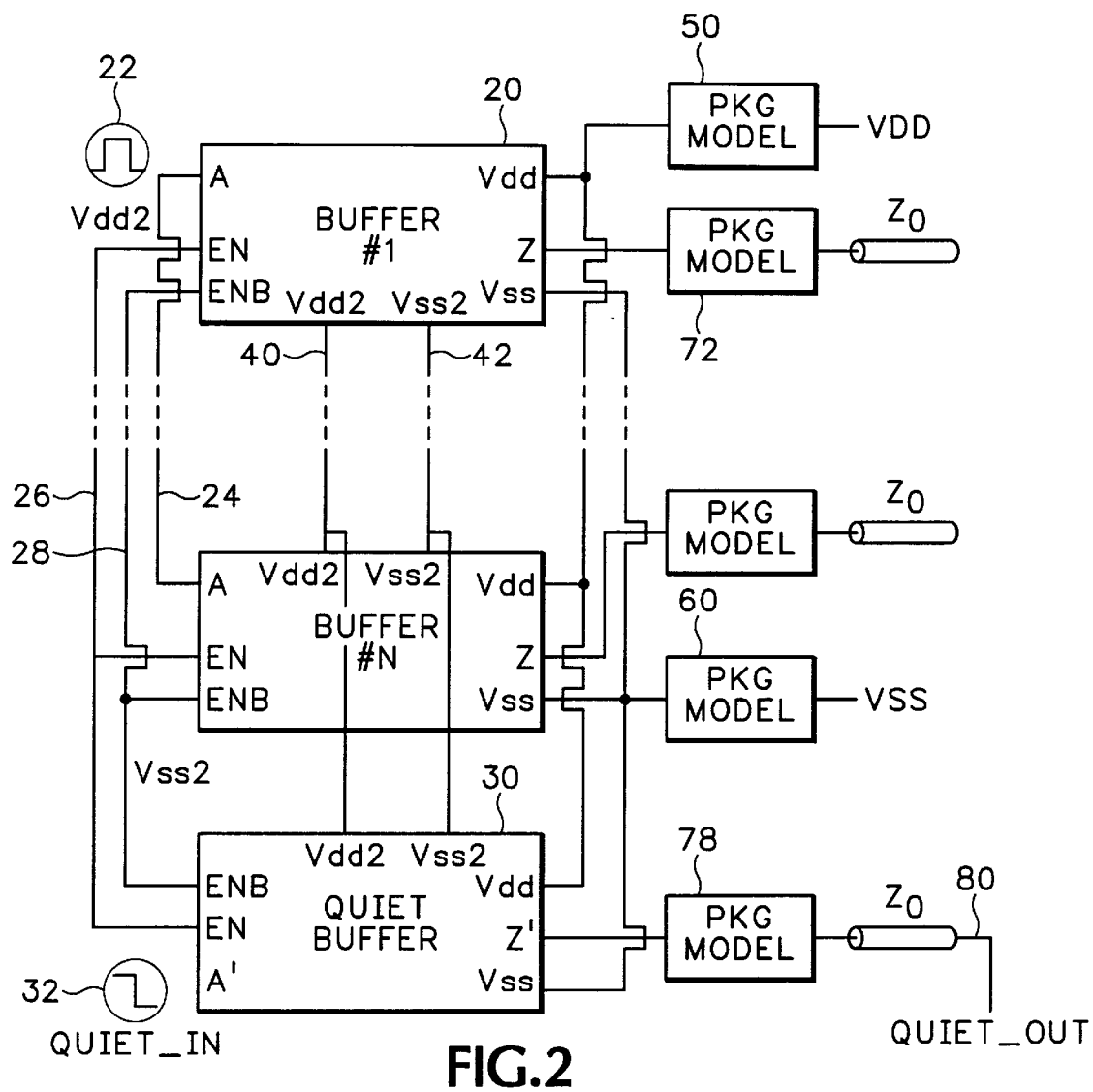
FIG. 2 is a schematic diagram of an I/O cluster model useful for simulation of SSN conditions and measurements of SSN effects.
Figure 3:
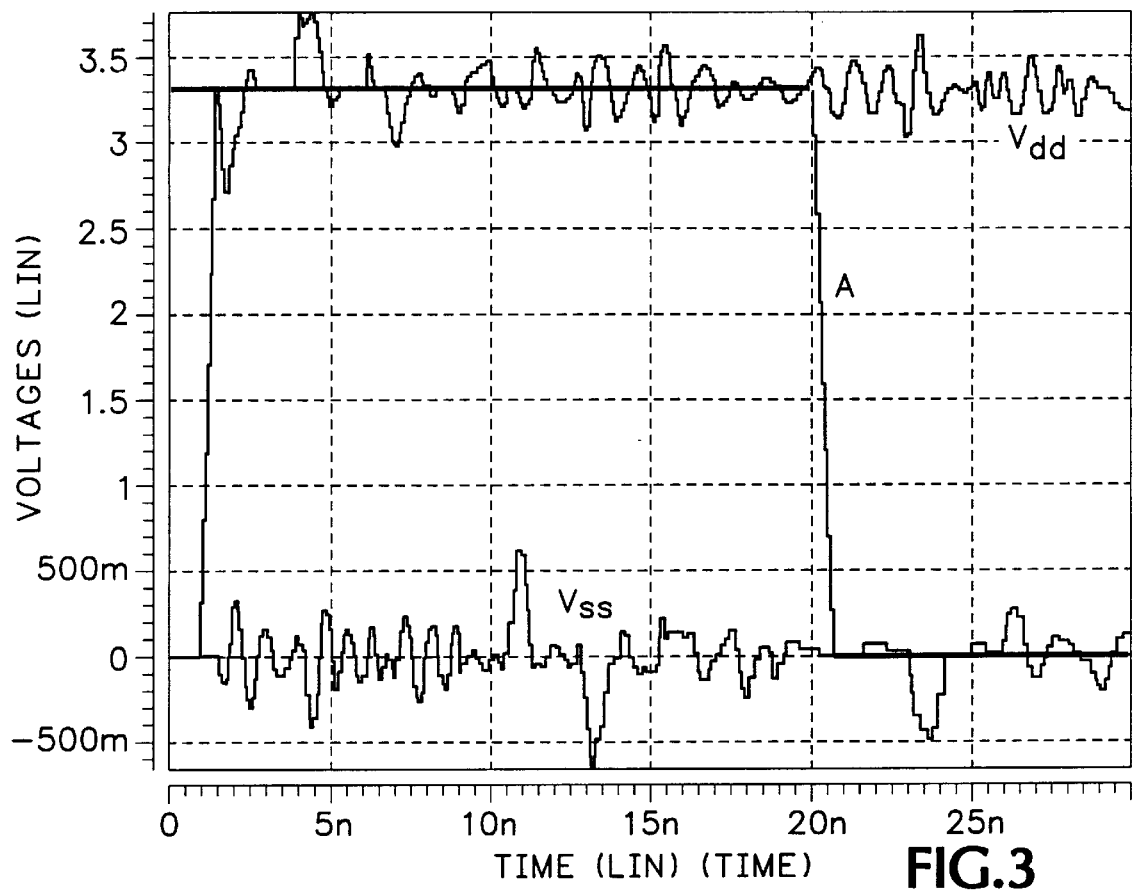
FIG. 3 is a plot of a simulation of power/ground noise in a single switching buffer along with a quiet buffer.

P+ emitter region 380, N+ contact region 90, and N+ floating drain region 100 each preferably have dimensions similar to P+ contact region 360 and N+ source region 70, i.e., a length (as measured from left to right in the dimension illustrated in FIG. 3) of from about 1 μm (10,000 Angstroms (Å)) to about 9 μm (90,000 Å), a width (the dimension into the paper in FIG. 3) of from about 1 mil (25.4 μm) to about 2.5 mils (63.5 μm), and a depth (height) of from about 0.1 μm (1,000 Å) to about 0.2 μm (2,000 Å).

In the illustrated embodiment, a gate oxide layer 110 is formed on the surface of substrate 340 between N+ source region 70 and N+ floating drain region 100, with a gate electrode 120, preferably comprising doped polysilicon, formed over gate oxide 110. Gate oxide layer 110 preferably has a thickness ranging from about 7 nm (70 Å) to about 10 nm (100 Å), typically about 7 nm. A channel region 130 in substrate 340 beneath gate oxide layer 110 has a channel length of from about 0.1 μm (1,000 Å) to about 1 μm (10,000 Å).

P+ contact region 360, N+ source region 70, and gate electrode 120 are electrically connected together by a first electrically conductive bus member 140 which is, in turn, electrically connected to ground, e.g., a Vss bus. First electrically conductive bus member 140 may comprise one or more doped polysilicon layers or one or more metal layers, or a combination thereof as is well known to those skilled in the art of forming electrical busses for integrated circuit structures. P+ emitter region 380 and N+ contact region 90 are electrically connected together by a second electrically conductive bus member 150 to a portion of the integrated circuit structure to be protected against damage by ESD, such as for example, and input/output (I/O) pin.

Figure 10A:
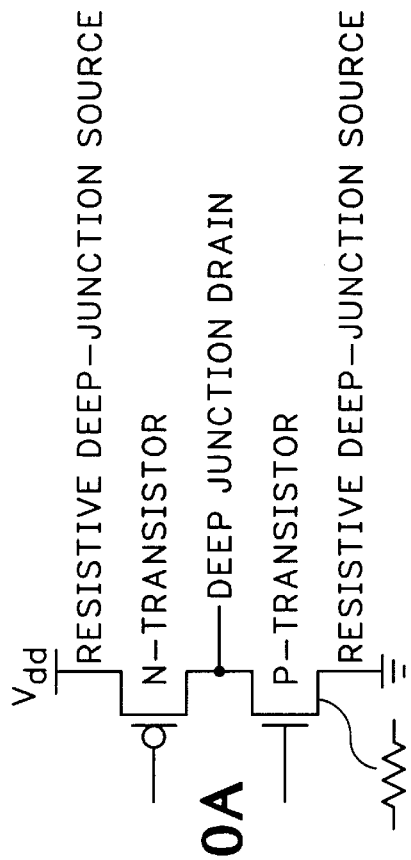
FIG. 10A is a schematic diagram of an I/O circuit according to the present invention.

The present invention extends the use of deep well structures into a new, compact structure for addressing both SSN and ESD immunity. FIG. 10A shows an I/O structure according to present invention that is useful for addressing both SSN and ESD immunity. The series arrangement of complementary transistors with a common drain terminal in known, but these transistors have a novel structure, described next.

Figure 10B:
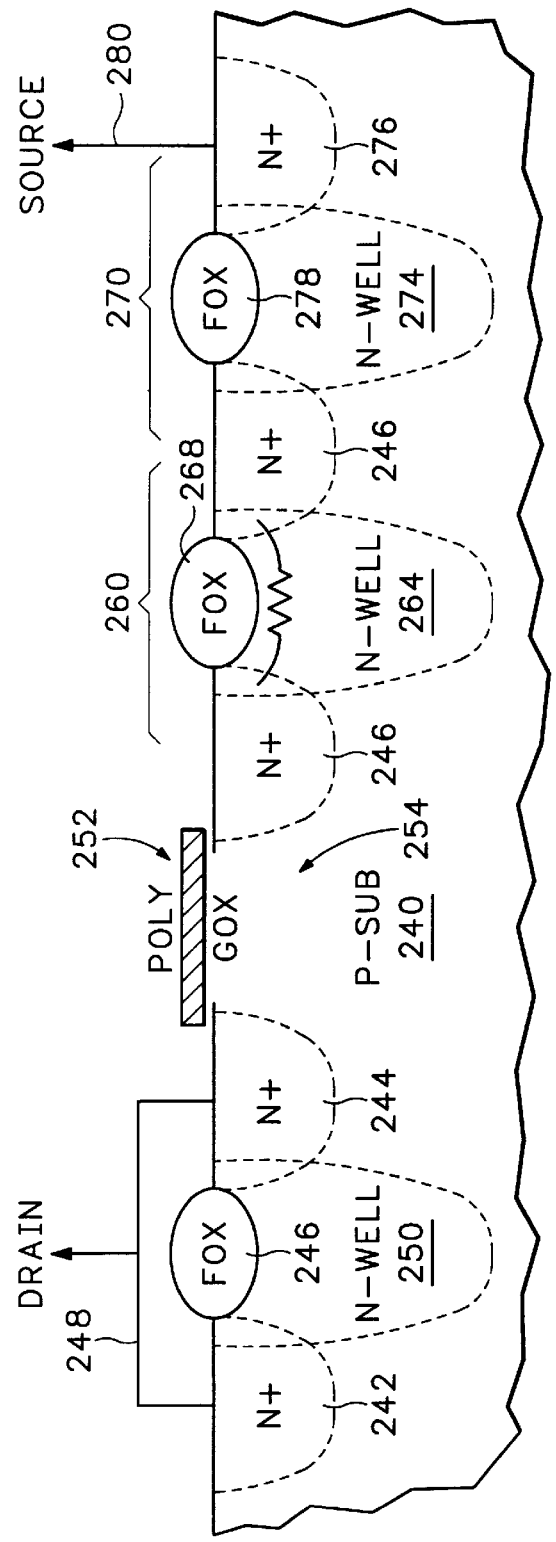
FIG. 10B is a cross-sectional view of the n-transistor portion of the circuit of FIG. 10A showing formation of a deep-junction drain region and multi-cascaded, resistive deep-junction source region according to the present invention.
Figure 11:
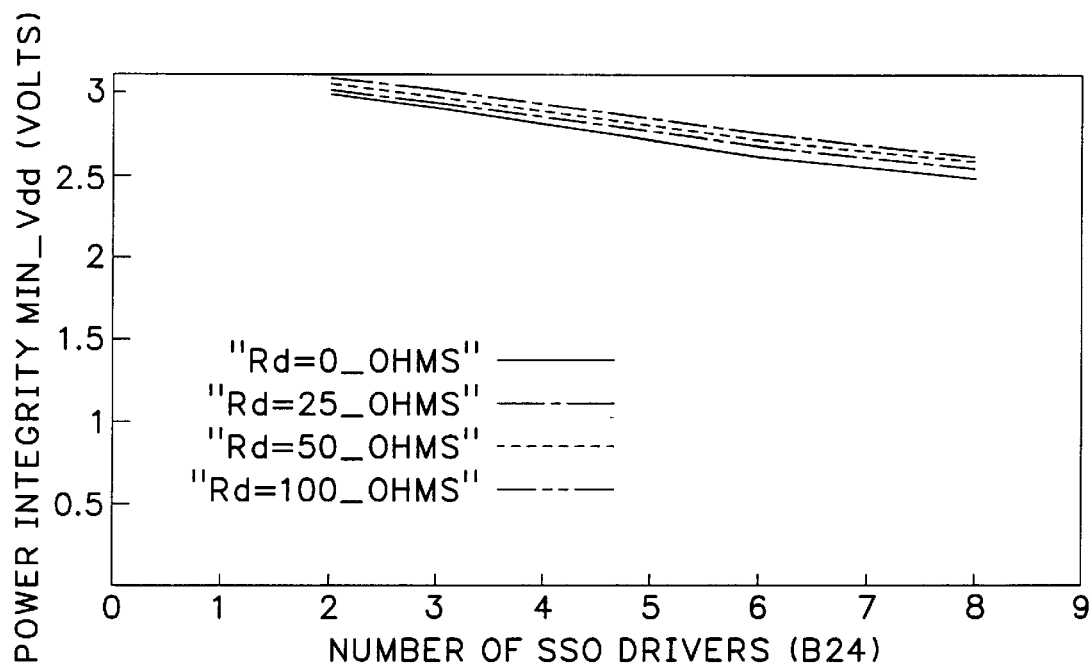
FIG. 11 is a simulation plot of power integrity minimum vs. number of simultaneous switching output drivers showing the effects of selected values of damping resistors on the minimum supply voltage Vdd using the simulation model of FIG. 2.
Figure 12:
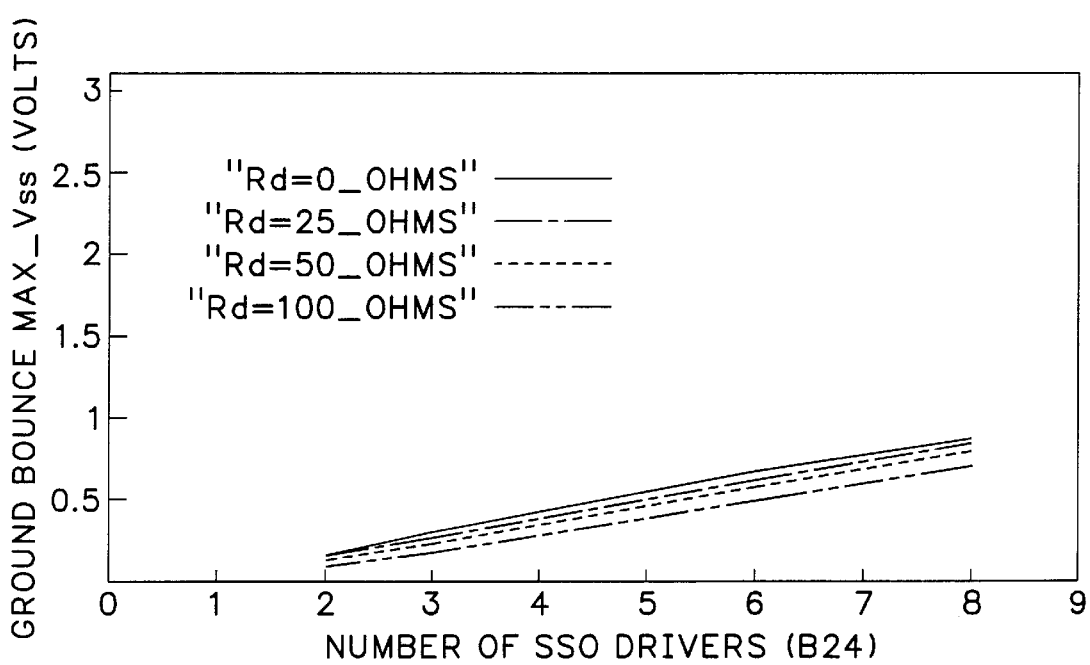
FIG. 12 is a simulation plot of ground bounce (max. Vss) as a function of damping resistor size and the number of simultaneous switching output drivers using the simulation model of FIG. 2.
Figure 13:
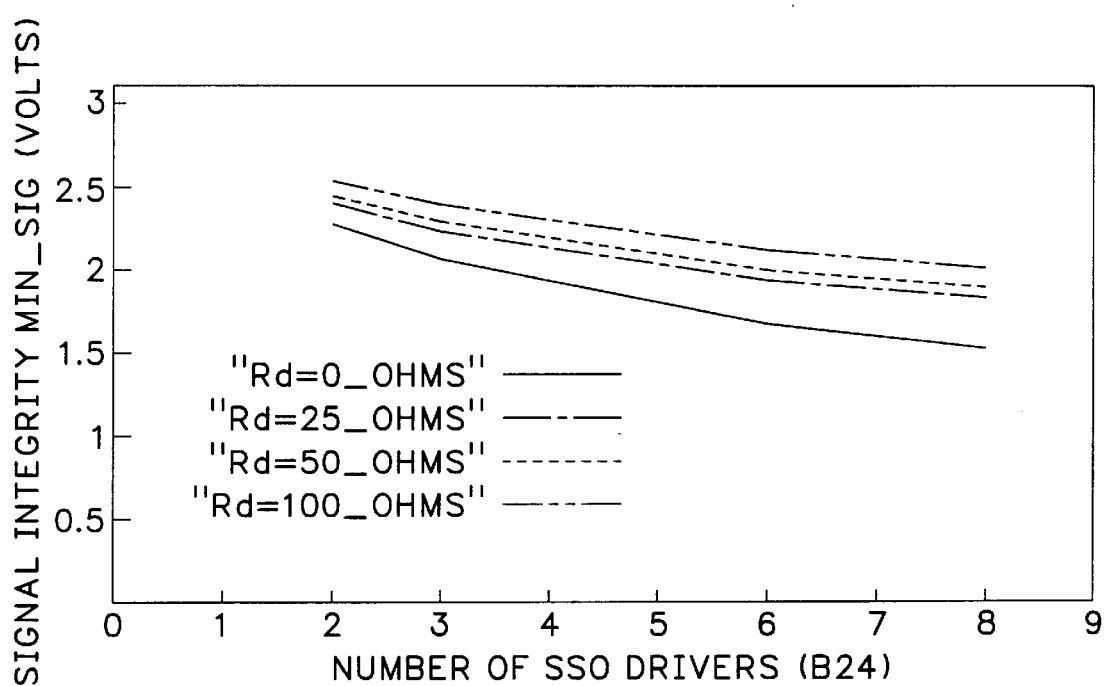
FIG. 13 is a simulation plot of signal integrity vs. number of simultaneous switching output drivers showing the effects of selected values of damping resistors on the minimum signal voltage using the simulation model of FIG. 2.
Figure 14:
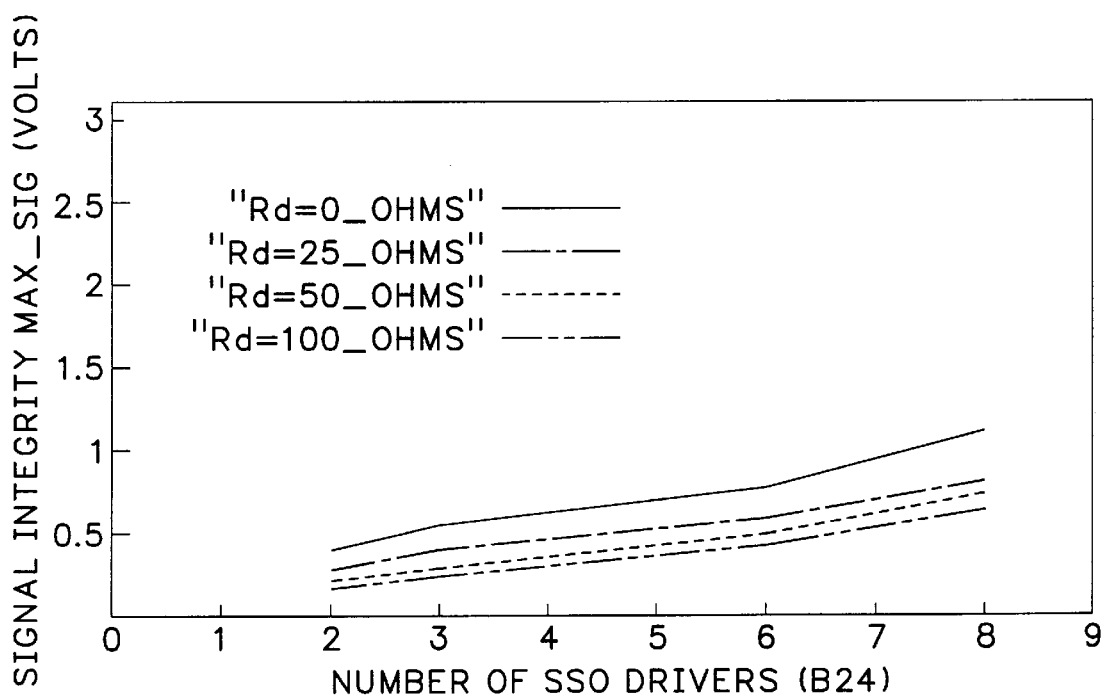
FIG. 14 is a simulation plot of signal integrity vs. number of simultaneous switching output drivers showing the effects of selected values of damping resistors on the maximum signal voltage using the simulation model of FIG. 2.

FIG. 10B is a fragmentary cross-sectional view of the n-transistor portion of the I/O circuit of FIG. 10A. The n-transistor is formed using conventional integrated circuit fabrication techniques in a p-type substrate 240. The drain region includes a deep n-well 250, a first n+ contact region 242 and a second n+ contact region 244. The first and second contact regions are electrically isolated from one another by field oxide 246. At the same time, the contact regions 242 and 244 are electrically connected together by conductor 248 forming the drain terminal. Conductor 248 may be formed of polysilicon, metal or another conductive material. A gate region 252 comprises a polysilicon gate formed over a gate oxide as is conventional, over a channel region generally indicted as 254. The gate region of course is formed intermediate the drain region and a resistive deep-junction source region, described next.

The source region includes a plurality of cascaded resistive elements so as to provide a series resistance between the source region and the channel 254. A first resistive element 260 includes first and second ohmic n+ contact regions 262, 266, electrically isolated from each other by field oxide 268. A deep n-well 264 is diffused or implanted into substrate 240 intermediate the first and second ohmic contact regions. The deep n-well 264 is in electrical contact with each of the first and second ohmic contact regions so that the deep well provides a resistive connection between the ohmic contact regions.

Similarly, a second resistive element 270 comprises first and second ohmic n+ contact regions 266, 276, separated by fox 278. Another deep n-well 274 is formed in the substrate 240 generally below the fox 278, so that the deep n-well 274 is in electrical contact with the ohmic contact regions 266, 276. It may be observed that the n+ contact region 266 is common to the first and second resistive elements 260, 270. In this way, a plurality of resistive elements are cascaded or connected together in series. While two such resistive elements have been shown and described for purposes of illustration, additional such elements can be employed to increase the resistance and to increase the effective volume of the deep junction source region.

One of the advantages of the structure illustrated in FIG. 10B is that the deep n-well regions 250, 264, 274 can be diffused into the substrate at the same time as the main n-well (not shown) that is used for forming the p-type transistor, and using the same mask. In other words, the deep n-wells preferably are formed to the same depth as the main n-well used in forming the p-type transistors. In this way, the improved structure of the present invention is implemented without any additional masking or processing steps as compared to building conventions I/O structures. Additional particulars of the methods for forming deep well structures of the type illustrated were described above with reference to the prior application for a "Method for Forming Minimum Area Structures for Sub-Micron CMOS ESD Protection in Integrated Circuit Structures Without Extra Implant and Mask Steps and Articles Formed Thereby". An improved p-type transistor with resistive deep-junction source an deep junction drain can be formed generally in the manner described, with all of the doping types being duly reversed.

Improved SSN immunity using the teachings of the present invention allows increasing the signal to power/ground ratio and hence more flip chip bumps or package pins can be allocated to useful signals rather than power requirements. This improvement can result in lower cost dies and higher performance designs, for example, in high-density ASIC applications. Additionally, reduction of ESD protection parasitics will permit increased I/O speeds. In general, combining the SSN immunity and driver ESD in accordance with the present invention results in more compact I/O designs which are essential to ultra large scale integration.

Having described and illustrated the principles of the invention in a preferred embodiment thereof, it should be apparent that the invention can be modified in arrangement and detail without departing from such principles. I claim all modifications and variation coming within the spirit and scope of the following claims.

We claim:

1. A method of minimizing simultaneous switching noise in an integrated circuit in which two or more output drivers share a common power supply connection, each output driver comprising a complementary pair of MOS transistors, and the method comprising:

forming an n-type one of the MOS transistors by
      providing a semiconductor substrate;
      forming at least three deep individual N wells in the substrate in accordance with standard main N-well process steps;
      forming selected field oxide portions in the surface of the substrate, including field oxide portions substantially registered over each of the individual N wells;
      forming a gate oxide layer, and a gate contact structure over the gate oxide layer comprising a gate terminal of the MOS transistor;
      and implanting into the exposed surface of the substrate with sufficient N dopant to form:
         a first N+ region positioned laterally adjacent to a first side of the gate structure and contiguous and in electrical contact with the first individual N well, so that the first N well provides a deep-junction drain region of the MOS transistor;
         a second N+ region positioned laterally adjacent to a second side of the gate structure and contiguous and in electrical contact with the second individual N well the second N+ region forming a first ohmic contact region;
         a third N+ region located laterally intermediate the second and third individual N wells, the third N+ region contiguous and in electrical contact with both the second and third individual N wells, and the third N+ region forming a second ohmic contact region; and
         a fourth N+ region contiguous and in electrical contact with the third individual N well, the fourth N+ region forming a source contact region of the MOS transistor, so that the second and third N+ regions together with the second individual N well form a series resistance element between the source contact region and the gate;

the series resistance element thus including the second individual N deep well diffused into the substrate and first and second contact regions each electrically connected to the deep well; and a portion of the oxide layer isolating the first and second contact regions from each other.

2. A process for forming an MOS transistor for providing electrostatic discharge (ESD) protection and supply voltage bounce suppression when used in an input-output (I/O) structure of an integrated circuit, the process comprising the steps of:

a) providing a P-type semiconductor substrate;

b) forming a first mask over said substrate having at least three openings therein spaced apart from one another for forming first, second and third individual N wells, respectively;

c) forming said individual N wells in said P type substrate beneath said openings in said first mask by implanting the substrate through said openings in said first mask with N type dopant in substantially the same manner as forming a main N-well;

d) masking said substrate with a second mask for forming field oxide portions in said substrate, the second mask having openings therein to form said field oxide portions substantially in registry with said individual N wells and further openings for providing at least one contact region to said substrate;

e) forming a field oxide layer over an exposed portion of the substrate not covered by the second mask, the field oxide layer including portions substantially registered over said individual N wells;

f) forming a gate oxide over an exposed portion of said substrate not covered with said field oxide, including a gate region between the first and second individual N wells;

g) forming an electrode over said gate oxide, comprising the gate electrode of the MOSFET;

h) masking said opening in the field oxide over the contact opening to said substrate with a third mask, and implanting the exposed surface of the substrate with sufficient N dopant so as to form:

a first N+ region contiguous and in electrical contact with the first individual N well in said P type substrate, the first N well comprising a deep-junction drain region of the MOSFET;

a second N+ region positioned laterally adjacent the gate structure, contiguous and in electrical contact with the second individual N well in said P type substrate;

a third N+ region located laterally intermediate the second and third individual N wells, the third N+ region contiguous and in electrical contact with both the second and third individual N wells, the exposed surfaces of the second and third N+ regions being isolated by the field oxide portion overlying the second individual N well; and a fourth N+ region contiguous and in electrical contact with the third individual N well in said P type substrate, the exposed surfaces of the third and fourth N+ regions being isolated by the field oxide portion overlying the third individual N well; the fourth N+ region comprising the source terminal of the MOSFET, and the second and third individual N wells, serially connected by the second, third and fourth N+ regions, together comprising a resistive deep-junction source region of the MOSFET;

to thereby provide an MOSFET structure enhanced for protecting portions of an integrated circuit structure from damage from ESD with enhanced current carrying capability and further providing a resistive source structure to power supply bounce in output applications with a minimum of processing steps and circuit area.

3. A method according to claim 2 wherein:

said first mask includes at least a fourth opening for forming at least a fourth individual N well;

said forming individual N wells includes forming at least a fourth N well in like manner to substantially the same depth as the first, second and third N wells;

said masking and forming field oxide steps include forming at least one additional portion of the field oxide, each additional portion of the field oxide being substantially registered over a respective one of the fourth and any additional N wells; and said implanting step includes forming at least a fifth N+ region, the fifth N+ region being contiguous and in electrical contact with the fourth individual N well in said P type substrate, and the exposed surfaces of the fifth and fourth N+ regions being isolated by the field oxide portion overlying the fourth individual N well;

each additional individual N well and each additional N+ region being formed in like fashion with each additional individual N well being electrically connected to the previous individual N well by means of an additional N+ region, seriatim, the second, third, fourth and any additional individual N wells and the second, third, fourth, fifth and any additional N+ regions so formed together comprising the resistive deep-junction source region of the MOSFET so that the current capacity and effective source junction resistance of the MOSFET can be scaled by the addition of additional N wells and corresponding N+ regions with no additional processing steps.

4. A method of minimizing simultaneous switching noise in an integrated circuit in which two or more output drivers share a power supply connection, each output driver comprising a complementary pair of MOS transistors, the MOS transistors including a N-type MOSFET formed by:

a) providing a P-type semiconductor substrate;

b) forming a first mask over said substrate having at least three openings therein spaced apart from one another for forming first, second and third individual N wells, respectively;

c) forming said individual N wells in said P type substrate beneath said openings in said first mask by implanting the substrate through said openings in said first mask with N type dopant in substantially the same manner as forming a main N-well;

d) masking said substrate with a second mask for forming field oxide portions in said substrate, the second mask having openings therein to form said field oxide portions substantially in registry with said individual N wells and further openings for providing at least one contact region to said substrate;

e) forming a field oxide layer over an exposed portion of the substrate not covered by the second mask, the field oxide layer including portions substantially registered over said individual N wells;

f) forming a gate oxide over an exposed portion of said substrate not covered with said field oxide, including a gate region between the first and second individual N wells;

g) forming an electrode over said gate oxide, comprising the gate electrode of the MOSFET;

h) masking said opening in the field oxide over the contact opening to said substrate with a third mask, and implanting the exposed surface of the substrate with sufficient N dopant so as to form:

a first N+ region contiguous and in electrical contact with the first individual N well in said P type substrate, the first N well comprising a deep-junction drain region of the MOSFET;

a second N+ region positioned laterally adjacent the gate structure, contiguous and in electrical contact with the second individual N well in said P type substrate;

a third N+ region located laterally intermediate the second and third individual N wells, the third N+ region contiguous and in electrical contact with both the second and third individual N wells, the exposed surfaces of the second and third N+ regions being isolated by the field oxide portion overlying the second individual N well;

a fourth N+ region contiguous and in electrical contact with the third individual N well in said P type substrate, the exposed surfaces of the third and fourth N+ regions being isolated by the field oxide portion overlying the third individual N well;

the fourth N+ region comprising the source terminal of the MOSFET, and the second and third individual N wells, serially connected by the second, third and fourth N+ regions, together comprising a resistive deep-junction source region of the MOSFET, so that the second and third contact regions together with the second individual N well forms a series resistance element between the source contact region and the gate of the MOSFET.

5. A method according to claim 4 wherein the second and third contact regions together with the second individual N well forms a series resistance element selected to have a resistance in a range of approximately 10 to 100 ohms.

* * * * *